United States Patent [19]
Krishnamurthy et al.

[11] Patent Number: 5,776,275
[45] Date of Patent: Jul. 7, 1998

[54] FABRICATION OF COMPACT MAGNETIC CIRCULATOR COMPONENTS IN MICROWAVE PACKAGES USING HIGH DENSITY INTERCONNECTIONS

[75] Inventors: Vikram Bidare Krishnamurthy, Latham; Kyung Wook Paik, Clifton Park; Mario Ghezzo, Ballston Lake; William Paul Kornrumpf, Albany; Eric Joseph Wildi, Niskayuna, all of N.Y.

[73] Assignee: Martin Marietta Corporation, King of Prussia, Pa.

[21] Appl. No.: 734,558

[22] Filed: Oct. 21, 1996

(Under 37 CFR 1.47)

Related U.S. Application Data

[62] Division of Ser. No. 421,180, Apr. 13, 1995, Pat. No. 5,653,841.

[51] Int. Cl.⁶ .............................. B29C 65/48; H01P 1/383
[52] U.S. Cl. .............. 156/150; 29/832; 29/852; 333/1.1; 427/97; 427/128; 427/131
[58] Field of Search ..................... 156/150, 151; 29/832, 852; 333/1.1; 427/97, 131, 128

[56] References Cited

U.S. PATENT DOCUMENTS 5,384,556  1/1995  Coles et al. ............... 333/1.1

*Primary Examiner*—Francis J. Lorin
*Attorney, Agent, or Firm*—Geoffrey H. Krauss; Brian J. Rees

[57] ABSTRACT

A magnetic circulator is incorporated into a multi-chip module using a microwave high density interconnect (HDI) structure. A prepackaged circulator can be inserted into a ready-made high density interconnected multi-chip module; this prepackaged circulator may use a stripline design having a signal line with two ground planes above and below the signal line, or a microstrip transmission line design having one signal line and one ground plane below the signal line. Alternatively a circulator can be manufactured directly in a high density interconnected multi-chip module, with a stripline, or a microstrip transmission line design.

12 Claims, 4 Drawing Sheets

FABRICATION OF COMPACT MAGNETIC CIRCULATOR COMPONENTS IN MICROWAVE PACKAGES USING HIGH DENSITY INTERCONNECTIONS

This is a division of application Ser. No. 08/421,180, filed Apr. 13, 1995, now U.S. Pat. No. 5,653,841.

BACKGROUND OF THE INVENTION

This invention relates generally to a method for making high density interconnect-compatible magnetic circulators.

Microwave components typically include active and passive devices which are formed to provide various types of microwave circuits. One such particular application is in a transmit/receive module (transceiver module) for use in phased array antennas. In these transceiver modules, active devices such as field effect transistors are combined with passive devices such as capacitors, resistors, inductive elements, and the like to form various microwave functions such as amplifiers and switches. In certain applications, it would be desirable to provide one or more circulators to steer electromagnetic energy through the transceiver modules.

Although non-reciprocal microwave components such as circulators have been known for many years, no convenient approach is available for combining the circulator function into a multi-chip module incorporating a high density interconnect (HDI) structure.

The interconnect structure used in the fabrication of high density interconnect (HDI) circuits has many advantages in the compact assembly of MCMs. For example, a multi-chip electronic system (such as a microcomputer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each being very costly, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 50–100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. The cavity bottom may be made respectively deeper or shallower at a location where a particularly thick or thin component will be placed, so that the upper surface of the corresponding component is in substantially the same plane as the upper surface of the rest of the components and the portion of the substrate which surrounds the cavity. The bottom of the cavity is then provided with a thermoplastic adhesive layer, which may preferably be a polyetherimide resin (such as ULTEM® 6000 resin, available from the General Electric Company, Fairfield, Conn.), or an adhesive composition such as is described in U.S. Pat. No. 5,270,371, herein incorporated in its entirety by reference. The various components are then placed in their desired locations within the cavity and the entire structure is heated to remove solvent and thermoplastically bond the individual components to the substrate.

Thereafter, a film, which may be "KAPTON®" polyimide, (available from E.I. du Pont de Nemours Company, Wilmington, Del.), of a thickness of approximately 0.0005–0.003 inches (approx. 12.5–75 microns), is pretreated by reactive ion etching (RIE) to promote adhesion. The substrate and chips must then be coated with ULTEM® 1000 polyetherimide resin or another thermoplastic adhesive to adhere the KAPTON® resin film when it is laminated across the tops of the chips, any other components and the substrate. Thereafter, via holes are provided (preferably by laser drilling) through the KAPTON® resin film, and ULTEM® resin layers, at locations in alignment with the contact pads on the electronic components to which it is desired to make contact. A multi-sublayer metallization layer, with a first sublayer comprising titanium (approximately 1000Å) and a second layer comprising copper (approximately 2000Å), is sputter deposited over the KAPTON® resin layer and extends into the via holes to make electrical contact to the contact pads disposed thereunder. The sputtered copper provides a seed layer for copper electroplating (3 to 4 microns thick). A final layer of titanium (1000Å) is sputter deposited to complete the Ti/Cu/Ti multilayer metallization. This metallization layer is patterned to form individual conductors using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the patents and applications listed hereinafter.

This high density interconnect structure provides many advantages. Included among these are the lightest weight and smallest volume packaging of such an electronic system presently available. A further, and possibly more significant, advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling; this process is straight-forward and fairly rapid.

The high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. Pat. No. 5,127,998, entitled "Area-Selective Metallization Process" by H. S. Cole, et al.; U.S. Pat. No. 5,258,920, entitled "Locally orientation Specific Routing System" by T. R. Haller, et al.; and U.S. Pat. No. 5,108,825, entitled "An Epoxy/Polyimide Copolymer Blend Dielectric and Layered Circuits Incorporating It" by C. W. Wojnarowski, et al; U.S. Pat. No. 5,300,812, entitled "Plasticized Polyetherimide Adhesive Composition and Usage" by Lupinski et al; and U.S. Pat. No. 5,206,712, entitled "Building Block Approach to Microwave Modules" by Kornrumpf et al. Each of these Patents and Patent Applications, including the references contained therein, is hereby incorporated in its entirety by reference.

Commercially available discrete magnetic circulators, packaged in a metal can, are readily available and are used in microwave circuits. However, trying to incorporate one of these circulators into a microwave HDI structure is problematic. For example, these commercially available circulators have a profile (height) which is not compatible with a HDI multi-chip module. This high profile presents several difficulties when trying to incorporate the presently available circulators into a high density interconnected multi-chip module. The commercially available circulators must be attached on a substrate using a conductive polymer adhesive. This causes signal loss due to transmission line discontinuity between the ground plane and voids in the conductive polymer adhesive. In addition, the non-hermiticity of the circulator component also causes a final hermetic assembly problem of the circulator/HDI module combination. Testability is another problem to be solved because the final microwave module cannot be tested unless the circulator component is attached to the module.

Consequently, an improved method for implementing a circulator into a high density interconnect multi-chip module, is desirable.

OBJECTS OF THE INVENTION

Accordingly, a primary object of the invention is to provide a novel method for manufacturing a pre-packaged circulator which can be easily incorporated into a high density interconnected multi-chip module.

Another object of the invention is to provide a novel method for manufacturing a high density interconnected multi-chip module containing a magnetic circulator.

SUMMARY OF THE INVENTION

The above and other objects, which will become apparent from the specification as a whole, including the drawings, are accomplished in accordance with the invention. A method of manufacturing a prepackaged circulator for insertion into a ready-made high density interconnected multi-chip module is disclosed. This prepackaged HDI-compatible circulator may comprise a general stripline design having a signal line with two ground planes, one above the signal line and one below, or more preferably, may comprise a microstrip transmission line design having one signal line and only one ground plane below the signal line.

A method of manufacturing a high density interconnected multi-chip module incorporating a circulator is also disclosed. This multi-chip module may comprise a circulator with the general stripline design, or more preferably, may comprise the microstrip transmission line design.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

DETAILED DESCRIPTION

Figure 1A:
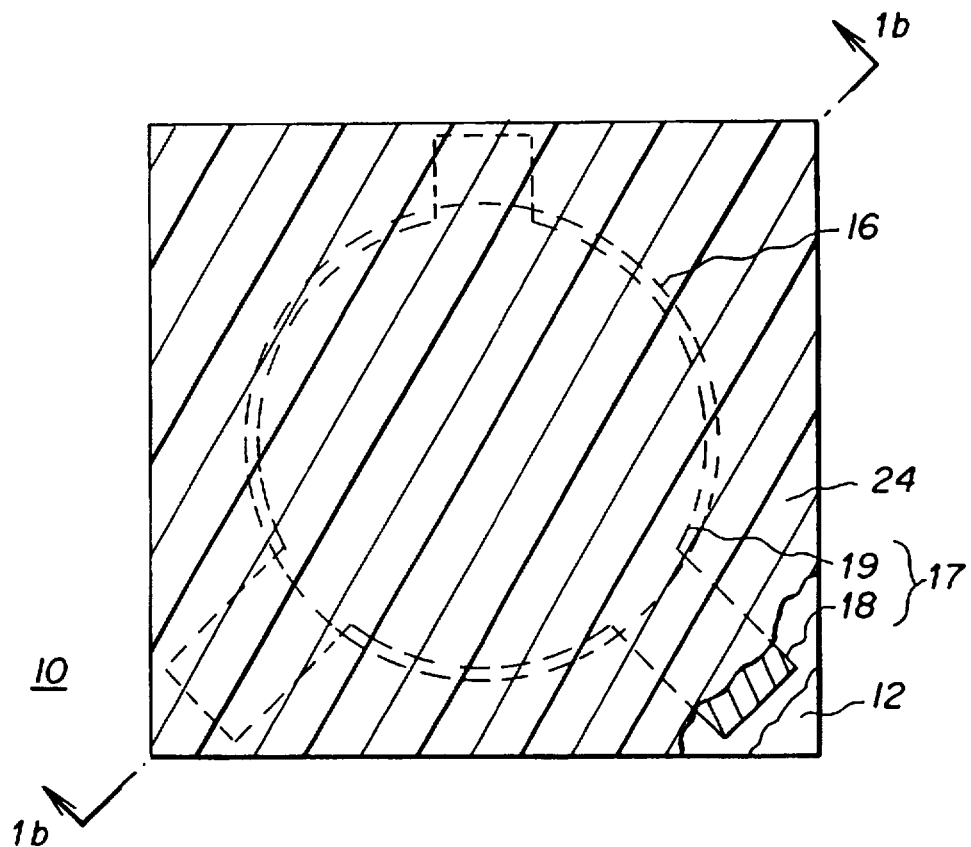
FIG. 1a and 1b are top and cross-sectional views, respectively, of a prepackaged, HDI-compatible, magnetic stripline circulator in an intermediate stage of fabrication.
Figure 1B:
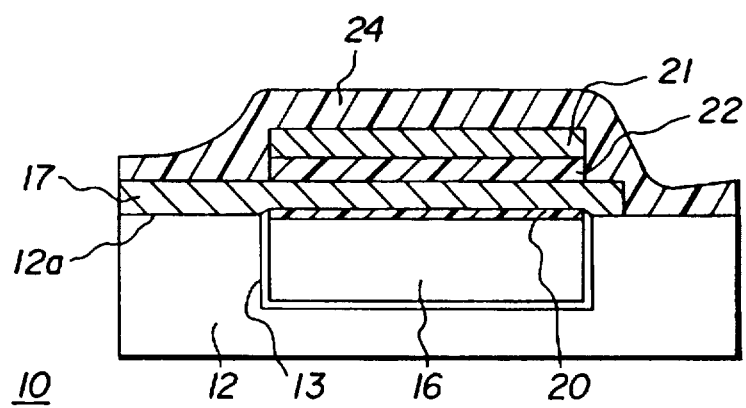

Referring initially to FIGS. 1a and 1b, top and cross-sectional views are shown of a prepackaged, HDI-compatible circulator 10 at an intermediate stage of manufacture. An insulative substrate 12 is provided with a chipwell 13 formed in a surface 12a thereof. A permanent magnet 16 is inserted into substrate chipwell 13. Permanent magnet 16 may have a multitude of designs and sizes, which will be known to those skilled in the art and will change depending on the intended use of circulator 10. For example, if circulator 10 is designed for use in the frequency range of about 2.7 GHz to about 2.9 GHz, the magnet may be made from a ceramic, such as samarium-cobalt (SmCo), or neodymium-iron-boron (NdFeB), and may have a diameter of about 0.59 inches and a strength of about 670 Gauss. If circulator 10 is designed for use in the frequency band of about 4–8 GHz, magnet 16 may have a diameter of about 0.275 inches to about 0.332 inches and a strength of about 960 Gauss. Whereas, if circulator 10 is designed for use in the frequency band of about 8–12 GHz, magnet 16 may have a diameter of about 0.170 inches to about 0.200 inches and a strength of about 1600 Gauss. Many variations in the characteristics of magnet 16 will be known to those skilled in the art, and all such modifications should be understood to be within the scope of the present invention.

An electrically conductive sheet 17 is dielectrically bonded to the magnet 16 by an adhesive 20. The dielectric adhesives described herein may be thermosetting or thermoplastic depending of the requirements of the overall multi-chip module into which circulator 10 will be incorporated. Any dielectric material which exhibits sufficient flow to provide a void-free bond is suitable for the adhesive. Preferred adhesives are thermoplastic polyetherimides, such as "Ultem 1000" polyetherimide, made by General Electric Co, Pittsfield, Mass.

Conductive sheet 17 acts as a ground plane and therefore may comprise any material which will be compatible with a microwave module, such as the one described in U.S. Pat. No. 5,206,712, entitled "Building Block Approach to Microwave Modules." A preferred material is a sheet of copper having a thickness of about 2 microns to about 4 microns. FIG. 1a illustrates conductive sheet 17 with three conductive input/output portions 18 connected to a central portion 19. Central portion 19 has a size approximating that of magnet 16. Copper sheet 17 is bonded to magnet 16 such that its center portion 19 is diametrically aligned with magnet 16. By diametrically aligned we mean that an imaginary center line drawn through the center of one component, perpendicular to a major face of that component, will approximately align with a similar imaginary line drawn through the other component. Three input/output tab portions 18 extend outwardly from conductive disk 19 and are substantially angularly equidistant from each other, i.e., each separated from one another by approximately 120 degrees. Alternatively, conductive sheet 17 may be approximately the same size as substrate surface 12a and may have holes pre-punched therein to make open spaces for subsequent via interconnections.

A ferrite disk 21 of any of the known microwave ferrite materials, is dielectrically bonded to, and diametrically aligned with, the conductive disk 19 with an adhesive 22. Ferrite disk 21 will also have a size that approximates permanent magnet 16; however, variations in the size, design and composition of ferrite disk 21 will be known to those skilled in the art. A typical ferrite disk comprises yttrium-iron-garnet (YIG) and is characterized by its saturation magnetization at 4*Pi*Ms. For example, for the above described circulator 10 designed for operation in the frequency ranges of about 2.7 GHz to about 2.9 GHz, ferrite disk 21 may comprise YIG and have a saturation magnetization of approximately 670 Gauss. If circulator 10 is designed for use in the 4–8 GHz frequency range, ferrite disk 21 may have a saturation magnetization of about 1800 Gauss and if designed for use in the 8–12 GHz range, ferrite disk 21 may have a saturation magnetization of about 2500 Gauss. Many modifications to the size and strength of any of the ferrite disks of the present invention will be known to those skilled in the art, and all such modifications should be understood to be within the scope of the present invention.

Next, a dielectric layer 24 is laminated over the entire structure i.e., over ferrite disk 21, copper sheet 17 and substrate 12. Dielectric film 24 may be laminated by conventional techniques. Dielectric film 24 can be made from any number of materials which have a coefficient of thermal expansion matching that of the multi-chip module. Preferred materials for lamination include "Kapton-E®" polyimide films available from E.I. Du Pont De Nemours Co., Wilmington DE, and "UBE Upilex" polyimide films, available from UBE Industries Ltd., Tokyo, Japan, or any dielectric material which exhibits sufficient stability to work in a circulator/module assembly.

Figure 2A:
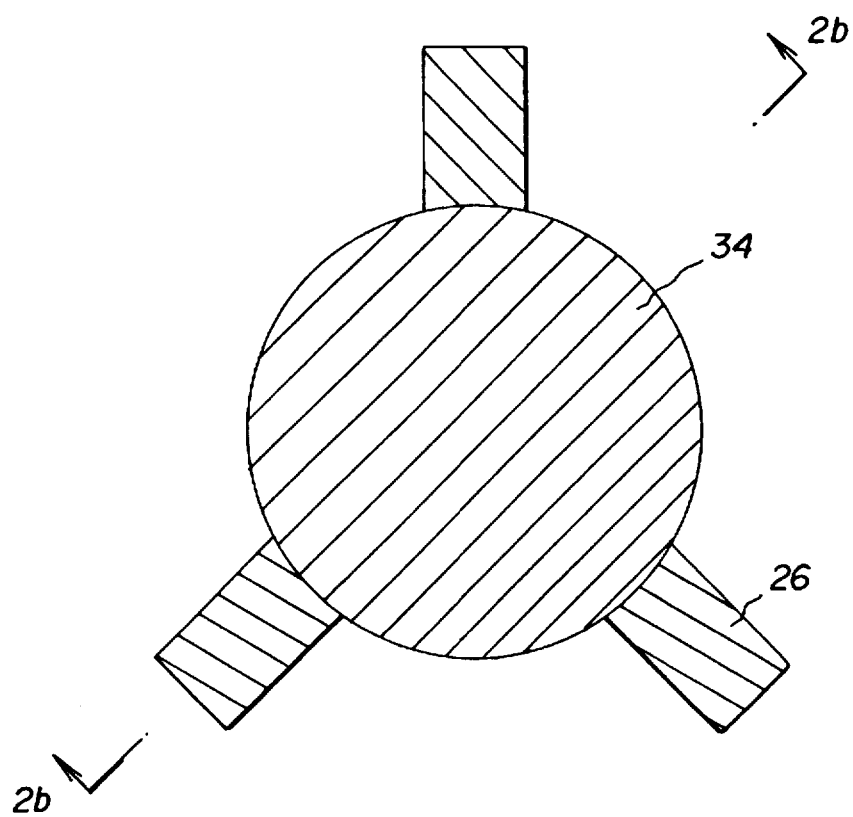
FIG. 2a and 2b are top and cross-sectional views, respectively, of a prepackaged, HDI-compatible, magnetic stripline circulator in a final stage of fabrication.
Figure 2B:
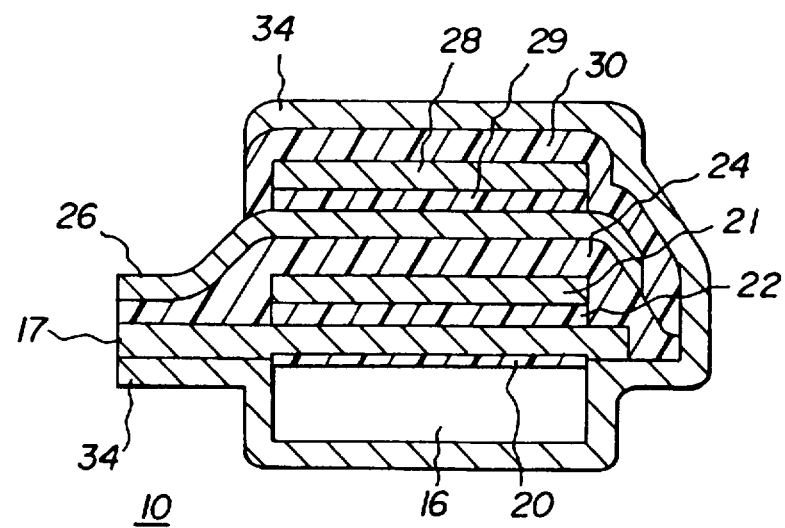

Referring now to FIGS. 2a and 2b, the next step in the manufacture of the circulator 10 is the deposition of a Y-shaped metallization layer 26. Y-shaped metallization 26 layer may be any conductive material capable of carrying energy in the microwave spectrum of electromagnetic energy. The height and width of metallization layer 26 may be varied in order to vary its electrical properties, e.g., impedance and the like. Yshaped metallization layer 26 is preferably formed by first depositing a titanium layer, then depositing a copper layer and finally depositing another titanium metal layer (Ti/Cu/Ti). The layers can range in thickness and any thickness may be used which provides sufficient conductivity to carry the electromagnetic energy. However, a preferred thickness of the initial titanium layer is approximately 1000Å, the preferred thickness of the copper layer is approximately 40,000Å and the preferred thickness of the final titanium layer is approximately 1000Å.

The Y shape of metallization layer 26 may be formed by many different methods known to those skilled in the art of photolithography. One such method is to form the Y-shaped metallization layer 26 by depositing the Ti/Cu/Ti layer over the entire structure, i.e., over dielectric layer 24, followed by patterning layer 26 through conventional photolithographic methods to provide the appropriate Y shape. Although designated as a "Y-shaped" metallization layer, metallization layer 26 actually has a center portion and three tab portions integrally extending therefrom. The center portion should be of approximately the same size as permanent magnet 16 and should, upon patterning, be diametrically aligned, center-to-center, with magnet 16. The three tab portions of layer 26 should extend outward from the center portion and, if conductive sheet 17 also has a Y shape, the tab portions should be aligned with the conductive sheet input/output tabs 18.

A second ferrite disk 28 is dielectrically bonded to Y-shaped metallization layer 26. Second ferrite disk 28 may comprise any of the known microwave ferrite materials, and may be the same composition as first ferrite disk 21, or may be a different composition. If the composition of second ferrite disk 28 varies from first ferrite disk 21, the properties of circulator 10 will be changed, and therefore, this is one way to "tune" circulator 10. For the objects of the present invention, it is preferred that second ferrite disk 28 is essentially identical to first ferrite disk 21, and is dielectrically bonded by a dielectric layer 29 to the Y-shaped metallization layer such that it is also diametrically centered with the permanent magnet 16. A top dielectric layer 30, similar in properties to dielectric layer 24 and preferably comprising "Kapton®" polyimide film, is laminated over the structure.

Then, the built-up structure is removed form substrate 12 (not shown in FIGS. 2a and 2b) and a layer 34 of a soft magnetic alloy layer 34 is deposited over the entire outer surface of the structure. The design and composition of soft magnetic alloy layer 34 will be well known in the art and may be varied depending on the intended final use of circulator 10. Presently preferred compositions are pure iron (Fe) or "Permalloy" iron alloy, available from B&D Industrial and Mining Services, Inc. Jasper, Ala.

This soft magnetic alloy layer 34 may be formed in two steps by first depositing a layer over the top of the structure, followed by depositing a layer over the bottom of the structure; or may be formed in one step by continuously depositing the magnetic alloy and rotating the structure such that deposition occurs everywhere. The methods for depositing magnetic alloy film 34 will be known to those skilled in the art of microelectronics processes.

The magnetic alloy layer 34 which is deposited upon top dielectric layer 30 serves two distinct functions. First, the portion of layer 34 on dielectric layer 30 acts the same as layer 34 on the bottom of the permanent magnet - it acts as a shield to inhibit any electromagnetic energy from escaping circulator 10. Additionally, the portion of magnetic alloy layer 34 which is on the top surface of dielectric layer 30 acts as a top ground plane. This is important because the presently preferred circulator design utilizes soft magnetic alloy layer 34 for a the second ground plane necessary in a stripline design.

Finally, a laser is used to ablate away all material from the tab portion of the Y-shaped metallization layer 26, as shown by the completely fabricated, prepackaged, HDI-compatible circulator 10 illustrated in FIGS. 2a and 2b. Circulator 10 is capable of being inserted into a multi-chip module incorporating a high density interconnect structure, such as the one described in above referenced U.S. Pat. No. 5,206,712 entitled "Building Block Approach to Microwave Modules." One method of incorporating circulator 10 into a multi-chip module is to ablate away a large section of the high density interconnect structure of the module for insertion of circulator 10. This can be done by using an eximer laser for the large area ablation. After ablation, circulator 10 may simply be placed and bonded into the hole created by the ablation. The prepackaged circulator 10 is bonded to an existing high density interconnected multi-chip module by a ribbon bond or solder.

A significant advantage of the prepackaged circulator 10 of the present invention is that it can be pretested prior to insertion into a module—thereby ensuring a workable module. The method of pretesting circulator 10 will be known to those skilled in the art and may be accomplished by placing circulator 10 into a special fixture suitable for probe measurements with a network analyzer. If circulator 10 is found to be defective, it may either be repaired or thrown away—all before insertion into a module.

It should be understood that it is within the scope of the present invention to dispose a plurality of magnet components 16 into a plurality of chip wells 13 and build up a plurality of circulators simultaneously. Each discrete circulator 10 will have magnet 16, ferrite disks 21 and 30, etc., to create a plurality of discrete stripline circulators 10. Then to create the individual prepackaged HDI-compatible circulators, all that remains is dicing the plurality of circulators into individual circulators 10.

Figure 3:
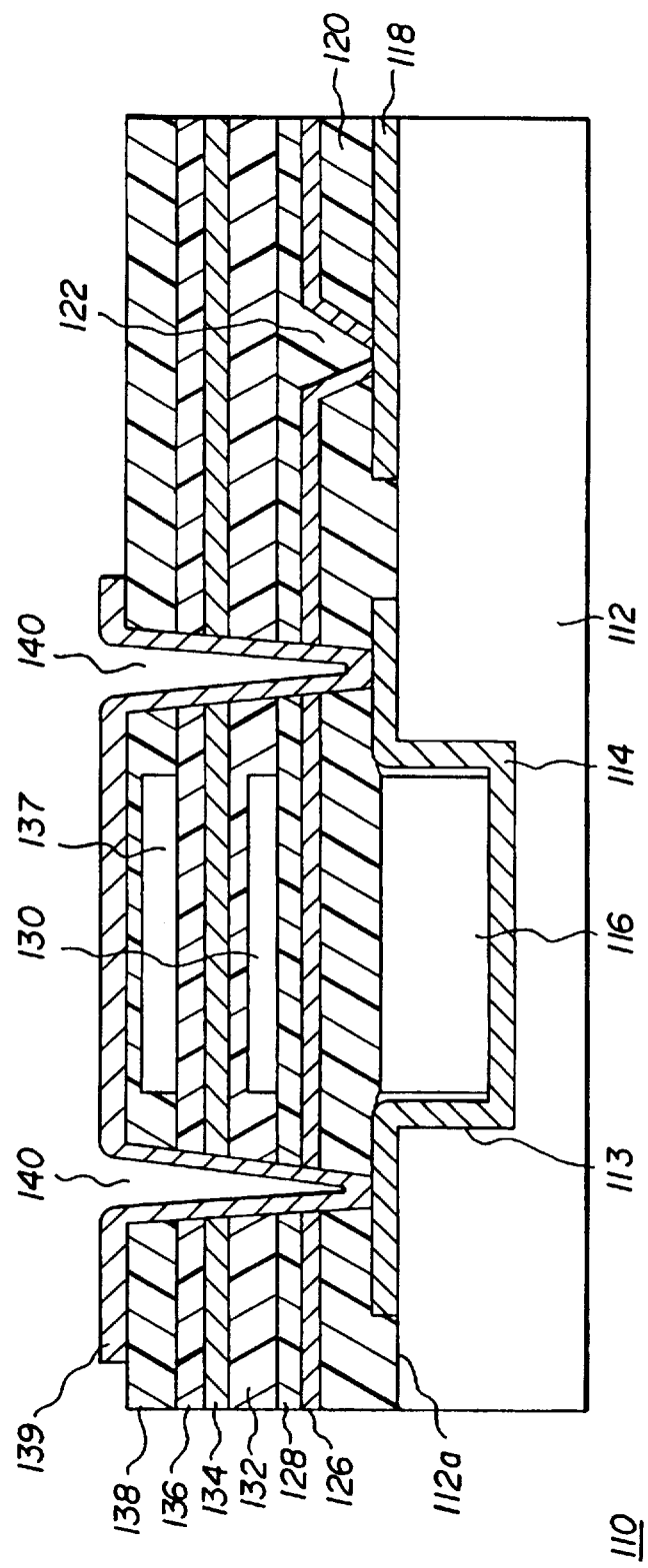
FIG. 3 is a cross-sectional view of a first embodiment of a multi-chip module incorporating a high density interconnect structure as well as a stripline magnetic circulator structure.

Instead of inserting a HDI-compatible circulator into an existing module, it may be advantageous to build the circulator structure directly within a multi-chip module during module fabrication. Referring now to FIG. 3, one embodiment of a high density interconnected circulator 110 is fabricated by first inserting a permanent magnet 116, having similar properties to that described hereinabove, into a substrate 112 having a chipwell 113 disposed in a surface 112a thereof; the surface 112a and chip well 113 have previously been coated with a lower soft magnetic film 114, with properties similar to layer 34 described hereinabove. The substrate may optionally have a module ground contact layer 118 deposited thereon.

A first dielectric layer 120, e.g., "Kapton®" polyimide, is laminated over permanent magnet 116, and a ground plane 126 is deposited over the dielectric layer 120. Ground plane 126 may be a sputtered sheet of conductive material or may be a sheet of conductive material which is dielectrically bonded to dielectric layer 120. Although any conductive material may be used, sputtered copper is the preferred material because of its electrical properties, low cost, ease of application, and with or without titanium as a "primer", its improved adhesion to polymers. Similar to conductive sheet 17, described in detail hereinabove, ground plane 126 may be a copper sheet with holes punched therein for subsequent via interconnection, or may be a thick layer of sputtered copper. Further, ground plane 126 may optionally be patterned through conventional processes to form the conductive disk (diametrically centered over the permanent magnet) and three input/output tabs, e.g., similar to center portion 19 and input/output portion 18 described hereinabove. At least one via hole 122 should be drilled through first dielectric layer 120 to make an electrical interconnection between module ground 118 and the circulator ground plane 126.

Next, a second dielectric layer 128, e.g., "Kapton®" polyimide, is laminated over ground plane 126 and a first ferrite disk 130 is deposited over second dielectric layer 128 such that it is diametrically centered over permanent magnet 116. A third dielectric layer 130, e.g., "Kapton®" polyimide, is laminated over first ferrite disk 130 and second dielectric layer 128, thereby enclosing disk 130. Then, a Y-shaped metallization layer 134 is deposited over the third dielectric layer 132. Y-shaped metallization layer 134 is identical in shape, composition and orientation to Y-shaped metallization layer 26 described hereinabove. Layer 134 has a center portion and outer tab portions and is disposed over third dielectric layer 132 such that the center portion of Y-shaped metallization layer 134 is diametrically centered with permanent magnet 116 and, if ground plane 126 has a Y shape, the tab portions of layer 134 should align with the tab portions of layer 126.

A fourth dielectric layer 136, e.g., "Kapton®" polyimide, is then laminated over metallization layer 134 and a second ferrite disk 137 is diametrically centered with the permanent magnet 116 and fabricated over fourth dielectric layer 136. The properties of second ferrite disk 137 are typically similar to first ferrite disk 130; however they may be varied if the properties of circulator 110 are to be varied, or "tuned". A fifth dielectric, e.g., "Kapton®" polyimide, layer 138 is deposited over fourth dielectric layer 136, thereby enclosing second ferrite disk 137. Next, via holes 140 are drilled through the surface of fifth dielectric layer 138 to the lower soft magnetic film 114 disposed on substrate surface 112a. Via holes 140 are positioned outside the center portion of Y-shaped metallization layer 134 and may be approximately centered between the tab portions. Further, if ground plane 126 has holes punched therein rather than a Y shape, via holes 140 should be aligned with at least some of the punched holes. The via holes 140 are laser drilled, and thus the dielectric layers discussed herein should also be inherently laser ablatable or should be rendered laser ablatable in accordance with above referenced U.S. Pat. No. 5,169,678 entitled, "Laser Ablatable Polymer dielectrics and Methods."

After via holes 140 are drilled, an upper soft magnetic film 139 is deposited over the portion of the top of the fifth dielectric layer 138 and on the inner surfaces of via holes 140. Finally, a laser is used to ablate away all material from the tab portion of the Y-shaped metallization layer 134. What remains is a high density interconnected stripline circulator 110, as shown in FIG. 3. Circulator 110 may be a separate component in a high density interconnected multi-chip module assembly, or may be an integral part of the integrated circuits made in accordance with above referenced U.S. Pat. No. 5,206,712.

In certain applications, the power and isolation requirements for the circulator are such that the complexity of the stripline design is not necessary. In such applications, an alternative embodiment of the present invention will use a more compact microstripline design. Again, as stated above, it should be understood to be within the scope of the present invention to process the high density interconnected, stripline-circulator-containing, multi-chip module assembly with a plurality of circulator components.

Figure 4:
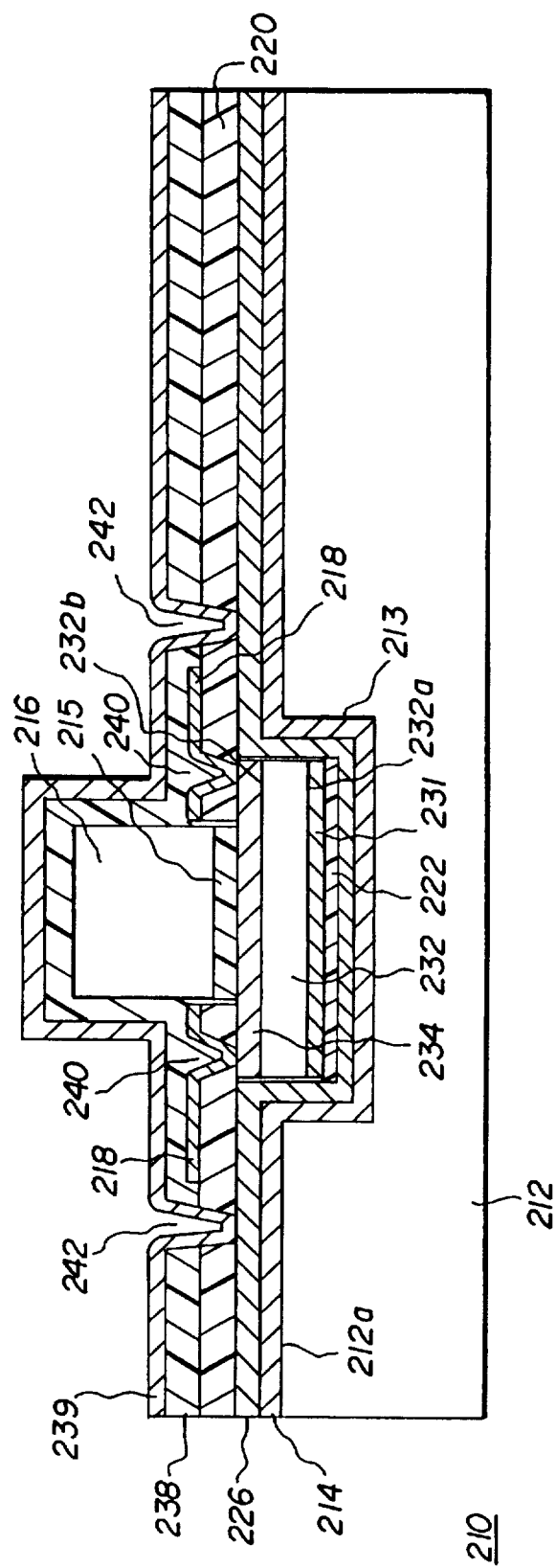
FIG. 4 is a cross-sectional view of a second embodiment of a multi-chip module incorporating a high density interconnect structure as well as a microstrip transmission line magnetic circulator structure.

Referring now to FIG. 4, a high density interconnected microstripline circulator 210 is fabricated by first depositing a lower soft magnetic alloy film 214 (identical to films 34, 114 and 139 described hereinabove) onto a substrate 212 having a surface 212a and into a chip well 213 disposed in surface 212a. Next, a ground plane 226 is deposited onto magnetic film 214, i.e., over the substrate surface 112a and into chipwell 113. Ground plane 226 may comprise any conductive material such as copper, aluminum, gold and the like, and preferably comprises a first layer of a titanium/ tungsten mixture, followed by a layer of gold. Similar to ground planes 17 and 126, ground plane 226 may comprise a sheet or may be a thick layer of sputtered copper. Ground plane 226 has a thickness which may be varied depending on the use of module 110, by typically has a thickness of about 4 microns A ferrite disk 232, having a bottom surface 232a and a top surface 232b is then inserted and bonded into chipwell 113 with a electrically conductive adhesive 222. Conductive adhesive 222 may be any material which will bond and hold ferrite disk 232 into place while maintaining electrical conductivity. Preferably, a conductive epoxy such as 184-LMIS made by ABLESTIK in Rancho Dominguez, Calif., is used. Ferrite disk 232 is identical to those described hereinabove, e.g., disks 21, 28, 130 and 137, except that in the present embodiment ferrite disk 232 is coated with conductive layers on the top and bottom surfaces. Conductive layer 231, coated on ferrite disk bottom surface 232a, is identical in composition to ground plane 226, and, with conductivity epoxy 222, maintains electrical conductivity between ground plane 226 and the bottom surface of ferrite disk 232a. The conductive layer 234 disposed on top surface 232b of ferrite disk 232 is a Y-shaped metallization layer having an inner conductive disk and outer tab portions. Y-shaped conductive layer 234 is identical in shape and composition to the Y-shaped metallization layers 26 and 134 described hereinabove.

After the ferrite disk 232 is bonded into the substrate chipwell 213, a dielectric layer 220, preferably comprising "Kapton®" polyimide, is laminated over ground plane 226 and ferrite disk 232, thereby enclosing disk 232. Via holes 240 are drilled through dielectric layer 220 and an input/ output metallization layer 218 is deposited so as to make electrical contact with the tab portions of Y-shaped metallization layer 234. Next, a permanent magnet 216 is diametrically centered with, and dielectrically bonded with adhesive 215 to dielectric layer 220, over the center disk portion of metallization layer 234. Optionally, dielectric layer 220 may be removed from over the center disk portion of metallization layer 234, and permanent magnet dielectrically bonded directly to the center portion of Y-shaped metallization layer 234.

Next, a dielectric layer 238 is laminated over the entire structure, i.e., over dielectric layer 220, metallization layer 218, and magnet 216. A plurality of via holes 242 are then formed through layers 238 and 220 making contact with ground plane 226. Finally, a top soft magnetic film 239 is coated over the entire top surface of the structure so as to shield the electromagnetic energy traveling through microstripline circulator 210, identical in purpose to layers 34, 114 and 139 described hereinabove.

The result is a microstripline circulator which is easily incorporated into a high density interconnected multi-chip module. Although a microstripline design has size and manufacturing advantages and power handling disadvantages over the stripline design, both designs are easily integrated with a high density interconnected integrated circuit and into a multi-chip module assembly. Those skilled in the art will know and understand the advantages and disadvantages of each design and the selection criteria for determining which design to manufacture.

Alternatively, if a stand-alone prepackaged microstripline circulator is desired, all that is necessary is to thin the thickness of substrate 212, either before or after the above fabrication procedure is complete, and to dice substrate 212 to remove the area outside the chip well, being certain to leave sufficient space for via holes 140, e.g., cutting away a portion of the substrate outside a diameter-line defined by an outermost portion of the outer tab portions of the Y-shaped metallization layer 234. Again, as stated above, it should be understood to be within the scope of the present invention to process either the high density interconnected microstripline circulator containing multi-chip module assembly or the prepackaged stripline circulator component with a plurality of circulator components.

While the invention is described herein in some detail, many modifications and variations will become apparent to those skilled in the art; it is our intent to be limited only by the scope of the appending claims, and not by the specific details or instrumentalities present herein by way of description of the preferred embodiments(s).

What is claimed is:

1. A method for making a high density interconnect-compatible stripline circulator, comprising the steps of:

(a) disposing a permanent magnet onto a surface of a substrate;

(b) bonding a conductive sheet to the permanent magnet, the conductive sheet having a plurality of holes disposed therein;

(c) dielectrically bonding a first ferrite disk to the conductive sheet;

(d) laminating a first dielectric layer to at least parts of the conductive sheet, to enclose the first ferrite disk;

(e) disposing a Y-shaped metallization layer over the second dielectric layer;

(f) dielectrically bonding a second ferrite disk to the Y-shaped metallization layer;

(g) laminating a second dielectric layer to at least portions of the first dielectric layer to enclose the second ferrite disk and at least parts of the Y-shaped metallization layer;

(h) drilling a plurality of via holes through the second dielectric layer to the substrate surface;

(i) metalizing the second dielectric layer and an inner surface of each of the via holes with a first member of a soft magnetic material;

(j) removing the substrate and metalizing the permanent magnet and bottom of the conductive sheet with a second member of a soft magnetic material; and (k) ablating the second dielectric film to expose portions of the Y-shaped metallization layer.

2. The method of claim 1, where the Y-shaped-metallization-layer-disposing step further includes the step of forming the metallization layer with a common central portion and three outer tabs, each outer tab being angularly equidistant from the remaining two tabs.

3. The method of claim 2, where the permanent-magnet-disposing step, the first-ferrite-disk-bonding step, the Y-shaped-metallization-layer-disposing step, and the second-ferrite-disk-bonding step are accomplished to leave the first ferrite disk, the center portion of the Y-shaped metallization layer and the second ferrite disk all diametrically aligned.

4. The method of claim 3, where the via-hole-drilling step includes at least some via holes aligned with the plurality of holes in the conductive sheet.

5. The method of claim 3, where the Y-shapedmetallization-layer-disposing step includes the steps of:

disposing a first layer of titanium; depositing a layer of copper upon the first layer; and depositing a second layer of titanium upon the copper layer.

6. The method of claim 3, wherein the second member acts as a top ground plane.

7. The method of claim 3, wherein the first- and second-member-disposing steps dispose the same soft magnetic material, and the two steps are done simultaneously.

8. A method for making a high density interconnected stripline circulator, comprising the steps of:

(a) disposing a first member of a soft magnetic material film onto a substrate surface and into a chipwell disposed in a surface of the substrate;

(b) disposing a permanent magnet into the coated chipwell;

(c) laminating a first dielectric layer to at least parts of the substrate surface, to enclose the permanent magnet;

(d) disposing a conductive sheet onto the first dielectric layer, the conductive sheet having a plurality of holes disposed therein;

(e) laminating a second dielectric layer to at least parts of the conductive sheet;

(f) disposing a first ferrite disk on the conductive sheet surface so that the first ferrite disk is diametrically centered with the permanent magnet;

(g) laminating a third dielectric layer to at least parts of the second dielectric layer and the first ferrite disk, to enclose the first ferrite disk;

(h) disposing a Y-shaped metallization layer with a common central portion and three outer tab portions, over the second dielectric layer so that the common central portion is diametrically centered with the permanent magnet;

(i) laminating a fourth dielectric layer to the Y-shaped metallization layer and to at least parts of the third dielectric layer, to enclose the Y-shaped metallization layer;

(j) disposing a second ferrite disk onto the fourth dielectric layer, so that the second ferrite disk is diametrically centered with the permanent magnet;

(k) laminating a fifth dielectric layer to at least parts of the fourth dielectric layer, to enclose the second ferrite disk;

(l) drilling a plurality of via holes through the fifth dielectric layer to the first member; and (m) metalizing the surface of the fifth dielectric layer and the inner surfaces of each of the via holes with a second member of a soft magnetic material film.

9. The method of claim 8, where the via-hole-drilling step includes the step of aligning the via holes with the plurality of via holes in the conductive sheet.

10. The method of claim 9, wherein the Y-shape-dmetallization-layer disposing step includes the steps of: disposing a first layer of titanium; depositing a layer of copper upon the first layer; and depositing a second layer of titanium upon the copper layer.

11. The method of claim 8, where the second soft magnetic material layer acts as a top ground plane.

12. The method of claim 8, where the Y-shape-dmetallization-layer-disposing step further includes the step of forming the metallization layer with each of the three outer tabs being angularly equidistant from the remaining two tabs.

* * * * *